(12) United States Patent
Jang

(10) Patent No.: US 7,737,913 B2
(45) Date of Patent: Jun. 15, 2010

(54) FLAT PANEL DISPLAY DEVICE AND PORTABLE DISPLAY APPARATUS USING THE SAME

(75) Inventor: Jin-Seok Jang, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 725 days.

(21) Appl. No.: 11/717,133

(22) Filed: Mar. 13, 2007

(65) Prior Publication Data

US 2008/0074408 A1 Mar. 27, 2008

(30) Foreign Application Priority Data

Sep. 22, 2006 (KR) .................... 10-2006-0092494

(51) Int. Cl.
*G09G 5/00* (2006.01)
(52) U.S. Cl. ...................................... 345/1.1
(58) Field of Classification Search ............... 345/1.1, 345/204–206; 455/566; 349/150, 149, 122, 349/84
See application file for complete search history.

(56) References Cited

U.S. PATENT DOCUMENTS

| 7,233,382 | B2 * | 6/2007 | Yamaji et al. | ............... | 349/150 |
| 7,350,326 | B2 * | 4/2008 | Hu | ............... | 40/544 |
| 7,385,598 | B2 * | 6/2008 | Jung et al. | ............... | 345/204 |
| 7,593,087 | B2 * | 9/2009 | Jang | ............... | 349/150 |
| 2005/0179850 | A1 * | 8/2005 | Du | ............... | 349/150 |
| 2006/0001819 | A1 * | 1/2006 | Maeng et al. | ............... | 349/149 |

FOREIGN PATENT DOCUMENTS

EP 1 158 347 11/2001

(Continued)

OTHER PUBLICATIONS

European Search Report issued on Jan. 16, 2008, corresponding to European Patent Application No. 07253751.7.

(Continued)

*Primary Examiner*—Richard Hjerpe
*Assistant Examiner*—Jeffrey Parker
(74) *Attorney, Agent, or Firm*—Robert E. Bushnell, Esq.

(57) ABSTRACT

The present invention relates to a dual type flat panel display device and a flexible printed circuit board that is integrated to simultaneously transfer electric signals to both of a light source device and a main display panel. According to one aspect of the present invention, the first flexible printed circuit board includes a first substrate portion, a second substrate portion, a third substrate portion, and a connection substrate portion. The first substrate portion is connected to a main display panel. The second substrate portion is disposed between the main display panel and a backlight unit, and is connected to the first substrate portion. The second substrate portion includes a light source device to transmit light into the backlight unit. The third substrate portion is disposed between the backlight unit and the printed circuit board, and is connected to the printed circuit board. The connection substrate portion connects the second substrate portion to the third substrate portion. The integrated flexible printed circuit board will make it possible to manufacture more compact portable display apparatus.

15 Claims, 7 Drawing Sheets

FOREIGN PATENT DOCUMENTS

| | | |
|---|---|---|
| EP | 1 640 791 | 3/2006 |
| JP | 2006-084969 | 3/2006 |
| JP | 2006-091435 | 4/2006 |
| JP | 2006-092985 | 4/2006 |
| KR | 10-2005-0064550 | 6/2005 |
| KR | 10-2006-0057951 | 5/2006 |

OTHER PUBLICATIONS

"Japanese Office action" issued on May 12, 2009 in corresponding Japanese Patent Application No. 2006-304144, along with Applicant's Letter of Transmittal.

* cited by examiner

FLAT PANEL DISPLAY DEVICE AND PORTABLE DISPLAY APPARATUS USING THE SAME

CLAIM OF PRIORITY

This application makes reference to, incorporates the same herein, and claims all benefits accruing under 35 U.S.C. §119 from an application for FLAT PANEL DISPLAY DEVICE AND PORTABLE DISPLAY APPARATUS USING THE SAME earlier filed in the Korean Intellectual Property Office on the $22^{nd}$ of Sep. 2006 and there duly assigned Serial No. 10-2006-0092494.

BACKGROUND OF THE INVENTION

1. Field of the Invention

The present invention relates to a dual type flat panel display device, and more specifically, a dual type flat panel display device and a portable display apparatus using the same, which includes an integrated flexible printed circuit board transferring electrical signals to the flat panel display panel and a light source device mounted in the flat panel display as a backlight unit

2. Description of the Related Art

In the contemporary terminology, a dual type flat panel display device means a flat panel display device including two display panels that display images in opposite directions. The two display panels are usually configured of a main display panel and a sub-display panel. For example, a main display panel is configured of a liquid crystal display device and a sub-display panel is configured of a liquid crystal display device or an organic electro-luminescence display device.

A dual type flat panel display device includes a printed circuit board for driving a main display panel, a first flexible printed circuit board for transferring signals form the printed circuit board to the main display panel to drive the main display panel, and a second flexible printed circuit board transferring signals form the printed circuit board to a sub-display panel to drive the sub-display panel A flexible printed circuit board (FPCB) is a type of a printed circuit board having flexibility. The flexible printed circuit board has a conductive thin film layer such as copper formed in a pattern on a base film of an insulated resin material, and has a protective film formed on the thin film layer. FIG. 1 is a cross-sectional view of a flexible printed circuit board. The flexible printed circuit board is disclosed in Korean Patent Laid-Open Publication No. 10-2005-0064550. According to the disclosure, the flexible printed circuit board is formed with conductive wiring layer 12 and protective film 30 covering wiring layer 12. A part of conductive wiring layer 12 is exposed without protective film 30 (portion a in FIG. 1) for a connection to a terminal of an external device. Conductive wiring layer 12 with a circuit pattern is formed on base film 11.

A dual type flat panel display device has an additional flexible printed circuit board in addition to the first and second flexible circuit board described above. The additional flexible printed circuit board is necessary to connect the printed circuit board to a light source device to provide necessary electrical energy to the light source device. The increased number of flexible printed circuit board, however, makes the structure of portable display apparatus complicated.

SUMMARY OF THE INVENTION

It is an object of the present invention to provide a dual type flexible flat panel display device and a portable display apparatus using the same. It is another object of the present invention to provide a flexible printed circuit board that is integrated to simultaneously transfer electric signals to both of a light source device and a main display panel.

According to one aspect of the present invention, there is provided a flat panel display device including a main display panel, a sub-display panel, a printed circuit board disposed between the main display panel and the sub-display panel, a backlight unit disposed between the printed circuit board and the main display panel, a first flexible printed circuit board coupled to the main display panel, backlight unit, and the printed circuit board, and a second flexible printed circuit board connecting the sub-display panel to the printed circuit board. The printed circuit board includes a main terminal portion and a sub-terminal portion.

The first flexible printed circuit board includes a first substrate portion, a second substrate portion, a third substrate portion, and a connection substrate portion. The first substrate portion is connected to the main display panel. The second substrate portion is disposed between the main display panel and the backlight unit, and is connected to the first substrate portion. The second substrate portion includes at least one light source device to transmit light into the backlight unit. The backlight unit transmits light produced from the light source device into the main display panel. The third substrate portion is disposed between the backlight unit and the printed circuit board, and is connected to the main terminal portion of the printed circuit board. The connection substrate portion connects the second substrate portion to the third substrate portion.

The dual type flat panel display device of the present invention has an advantage that electrical signals are applied to the main display panel and the light source at the same time through a flexible printed circuit board. Therefore an additional flexible printed circuit board for supplying electricity to the light source device is not necessary.

The flexible printed circuit board of the present invention prevents a dislocation of the light source device, which could be caused by heat generated during soldering process of printed circuit board and flexible printed circuit board.

Further, the flexible printed circuit board of the present invention has an advantage that the third substrate portion of the first flexible printed circuit board can be made relatively short in length because other driving elements are not mounted on the third substrate portion. Therefore, formation of terminal portion is relatively simple, and it is not necessary to extend the third portion over the entire surface of the printed circuit board.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, preferred embodiments of the present invention will be described in a more detailed manner with reference to the accompanying drawings.

Figure 1:
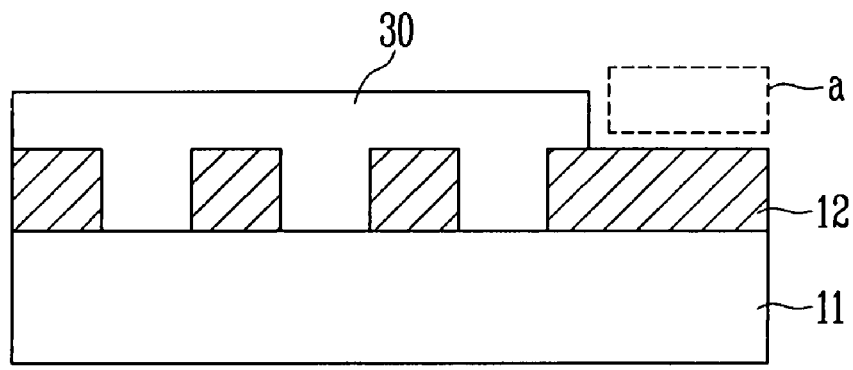
FIG. 1 is a cross-sectional view showing a flexible printed circuit board.
Figure 2A:
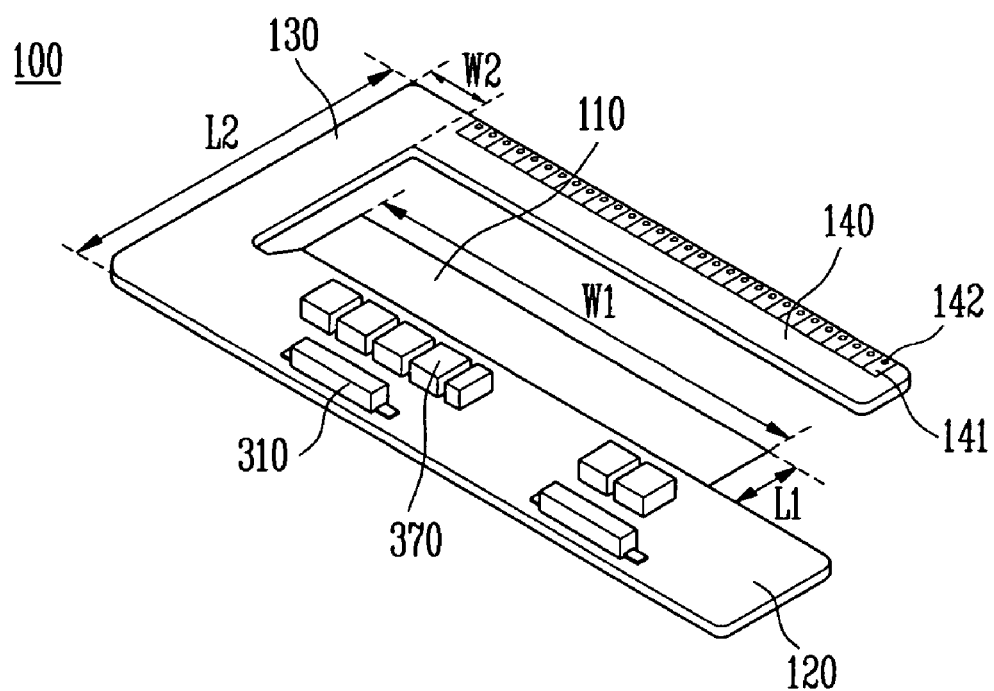
FIG. 2A is a perspective view showing a flexible printed circuit board constructed as one embodiment of the present invention.
Figure 2B:
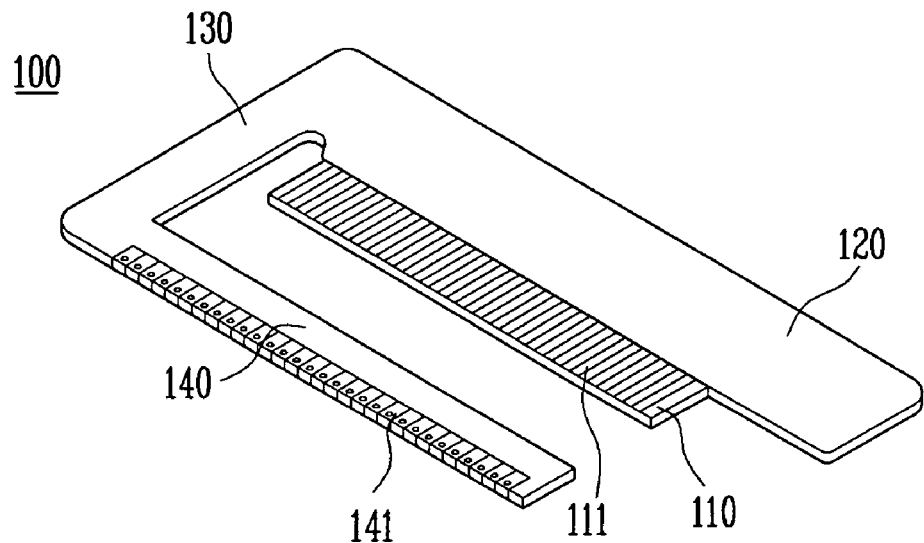
FIG. 2B is a bottom perspective view of the flexible printed circuit board shown in FIG. 2A.

FIG. 2A is a perspective view showing a flexible printed circuit board applied to a dual type flat panel display device constructed as one embodiment of the present invention, and FIG. 2B is a bottom perspective view of the flexible printed circuit board shown in FIG. 2A. Referring to FIGS. 2A and 2B, first flexible printed circuit board 100 includes first substrate portion 110, second substrate portion 120, connection substrate portion 130, and third substrate portion 140.

First substrate portion 110 includes at least one terminal 111 which can be connected to an external device. Terminal 111 is formed by exposing a conductive wiring layer enclosed in first substrate portion 110 of first flexible printed circuit board 100. First substrate portion 110 is connected to one part of second substrate portion 120 in a manner that the conductive wiring layer of first substrate portion 110 is connected to a conductive wiring layer of second substrate portion 120. In the present invention, first substrate portion 110 is a considerably bent part of first flexible printed circuit board 100, and therefore it is preferable that first substrate portion 110 has a single conductive wiring layer. In this case, the thickness of first substrate 110 is smaller than the thicknesses of second substrate portion 120 and third substrate portion 140.

Herein, terminologies related to substrate portions are defined. Referring to FIG. 2A, a width side and a length side of a substrate portion are defined as follows. A side of first substrate portion 110, along which first substrate portion 110 is connected to second substrate portion 120, is defined as a width side of first substrate portion. Therefore, as shown in FIG. 2A, first substrate portion 110 has two width sides, and one of the width sides of first substrate portion 110 is connected to second substrate portion 120. The size of the width side of first substrate portion 110 is defined as a width of first substrate portion 110. Accordingly, a length side of first substrate portion 110 is defined as a side substantially perpendicular to the width side of first substrate portion 110, and the size of the length side of first substrate portion 110 is defined as a length of first substrate portion 110. If first substrate portion 110 has a shape other than a rectangle, the width and length of first substrate portion 110 are defined as average sizes over a width side and a length side of first substrate portion 110, respectively. As the width sides and length sides of first substrate portion 110 form a surface or a plane, first substrate portion 110 has an upper surface and a lower surface. A thickness of first substrate portion 110 is defined as a distance between the upper surface and the lower surface of first substrate portion 110. The same definitions are applied to second, third, and connection substrate portions to define a width, a length, and a thickness.

As shown in FIG. 2A, a part of width side of second substrate portion 120 is connected to a width side of first substrate portion 110, and a part of length side of second substrate portion 120 is connected to a part of length side of connection substrate portion 130. A width side of connection substrate portion 130 is defined as a side that is substantially parallel to the width side of second substrate portion 120, and accordingly a length side of connection substrate portion 130 is defined as a side substantially perpendicular to the width side of connection substrate portion 130. The size of the width side of connection substrate portion 130 is defined as a width of connection substrate portion 110, and the size of the length side of connection substrate portion 130 is defined as a length of connection substrate portion 130.

As shown in FIGS. 2A and 2B, first substrate portion 110 is connected to around middle of a width side of second substrate portion 120, and connection substrate portion 130 is connected to a length side of second substrate portion 120. First substrate portion 110 and connection substrate portion 130 are stretched from second substrate portion 120 in the same direction (a length direction). The width W1 of first substrate portion 110 is larger than the width W2 of connection substrate portion, and the length L1 of first substrate portion 110 is smaller than the length L2 of connection substrate portion.

Driving components, to which electrical signals are applied, are mounted on second substrate portion 120. The driving components include light source device 310 and boosting circuit 370, but there is no limitation on the types of driving components that can be mounted on second substrate portion 120. In this embodiment, light source device 310 is preferably a light emitting diode.

Connection substrate portion 130 connects second substrate portion 120 to third substrate portion 140. Because connection substrate portion 130 is a portion to be bent, it is preferable that connection substrate portion 130 has single conductive wiring layer structure. In this case, the thickness of connection substrate portion 130 is smaller than those of second substrate portion 120 and third substrate portion 140.

Figure 2C:
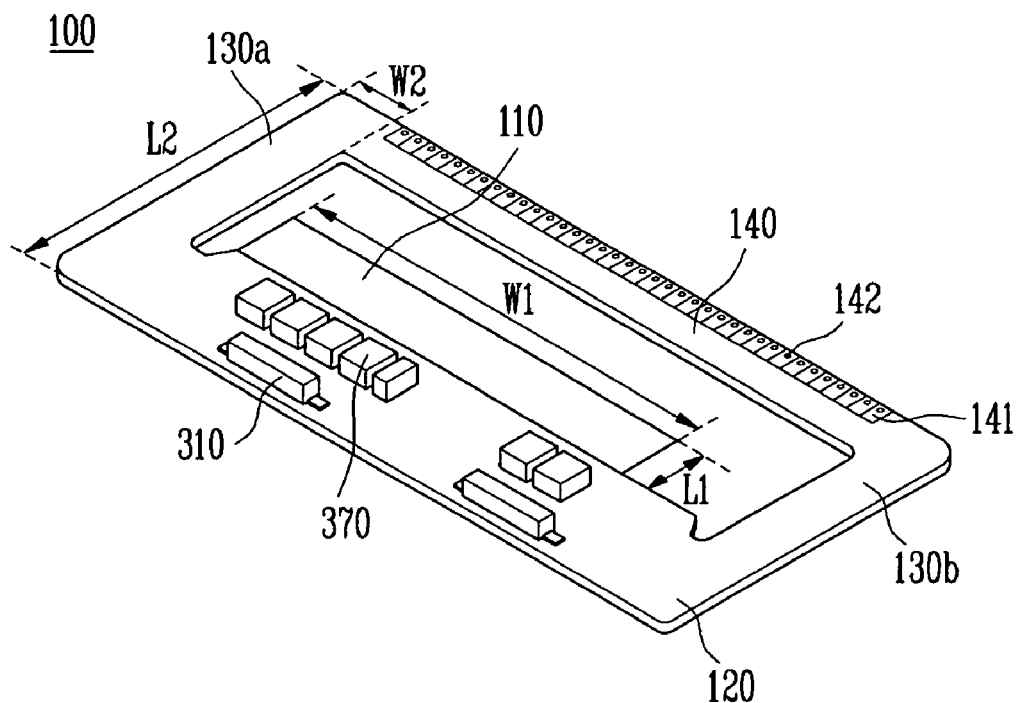
FIG. 2C is a perspective view showing a flexible printed circuit board constructed as another embodiment of the present invention.

First flexible printed circuit board 100 can have one or more connection substrate portion. FIG. 2C shows another embodiment where two connection substrate portions 130a and 130b are provided. First connection substrate portion 130a is formed at one end of second substrate portion 120, and second connection substrate portion 130b is formed at the other end of second substrate portion 120. At this time, the conductive wiring layer of second substrate portion 120 is divided into two to be connected to first connection substrate portion 130a and second connection substrate portion 130b, respectively.

Third substrate portion 140 includes at least one terminal 141, where the conductive wiring layer of third substrate portion 140 is exposed. The conductive wiring layer of third substrate portion 140 is connected to a conductive wiring layer of second substrate portion 120 through a conductive wiring layer of connection substrate portion 130. Through-hole 142 is formed in terminal 141. In the present invention, electricity that is necessary to drive light source device 310 is supplied through first flexible printed circuit board 100.

Therefore, the conductive wiring layer of third substrate portion 140 can include a sub-wiring for supplying electricity to light source device 310. The sub-wiring is connected to light source device 310 through connection substrate portion 130 and second substrate portion 120.

Figure 3:
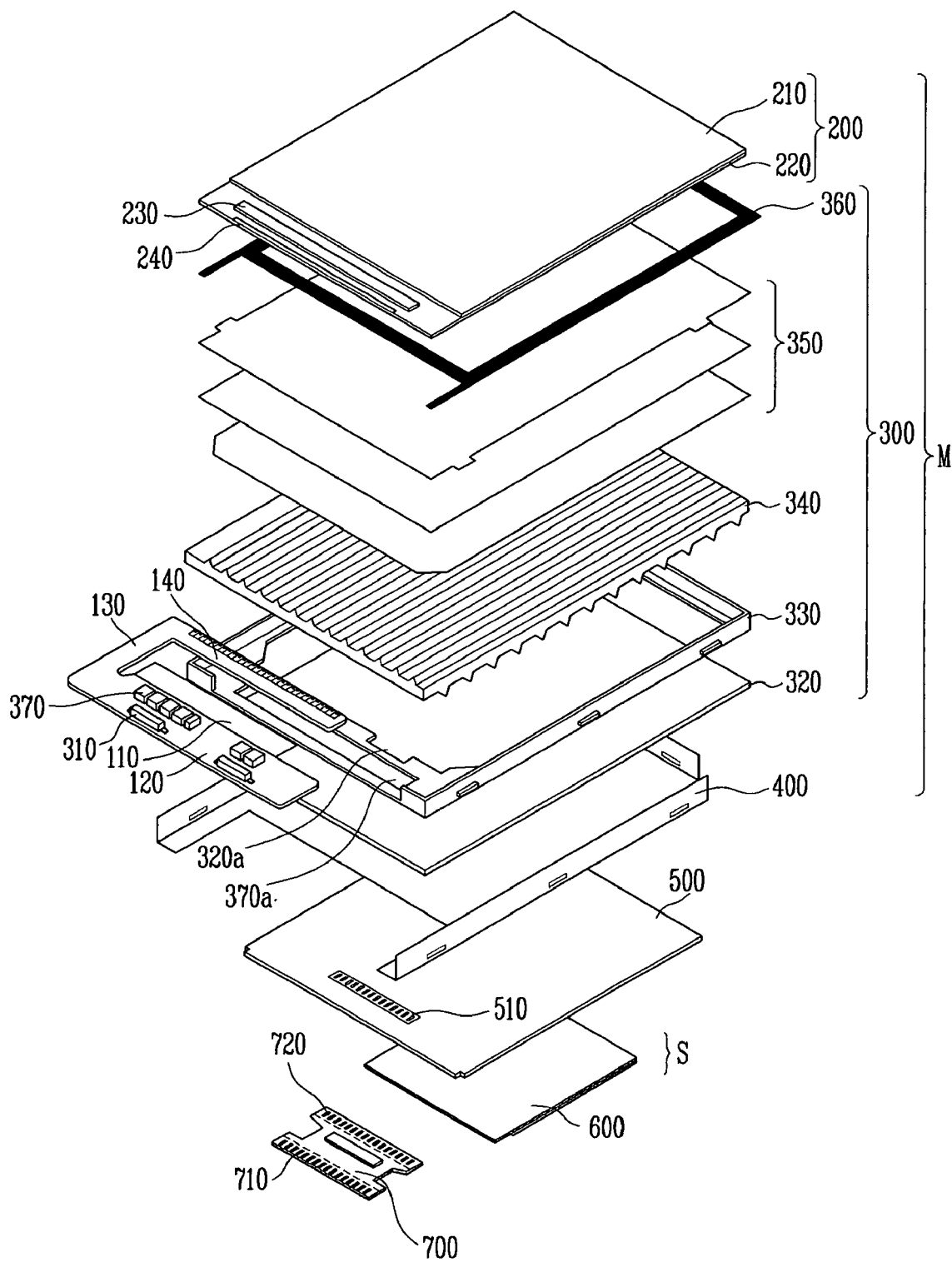
FIG. 3 is an exploded perspective view showing a dual type flat panel display device constructed according to the principles of one embodiment of the present invention.

Referring to FIG. 3, one embodiment of a dual type flat panel display device, to which the foregoing flexible printed circuit board is applied, will be described. FIG. 3 is an exploded perspective view showing a dual type flat panel display device constructed as an embodiment of the present invention. The dual type flat panel display device includes main display module M, sub-display module S, printed circuit board 500 for driving main display module M and sub-display module S, first flexible printed circuit substrate 100, and second flexible printed circuit substrate 700. Printed circuit board 500 is disposed between main display module M and sub-display module S.

Main display module M includes main display panel 200, backlight unit 300, bezel 400, and all parts and components installed between bezel 400 and main display panel 200. Backlight unit 300 is disposed between main display panel 200 and bezel 400.

Main display panel 200 of main display module M can be a liquid crystal display. The liquid crystal display requires backlight unit 300. The liquid crystal display includes first substrate 210, second substrate 220, and liquid crystal (not shown) injected between first substrate 210 and second substrate 220.

First substrate 210 and second substrate 220 are arranged in a manner that inner surfaces of first substrate 210 and second substrate 220 faces each other. A common electrode made of indium tin oxide (ITO) is formed on an inner surface of first substrate 210. A plurality of thin film transistors (TFT) are formed on an inner surface of second substrate 220 in a form of a two-dimensional array. A plurality of pixel electrodes is formed on the inner surface of second substrate 220, and each of pixel electrode is connected to one of the thin film transistors. Integrated circuit 230 is mounted on a portion of the inner surface of second substrate 220, and data signals and scan signals to drive main display panel 200 are supplied from integrated circuit 230. The second substrate also includes pad portion 240 that receives electrical signals from an external circuit such as a flexible printed circuit board. A polarizing plate (not shown) is further provided on external surfaces of first substrate 210 and second substrate 220.

When voltage is applied between the common electrode and a pixel electrode, electrical field is formed between the common electrode and the pixel electrode, and alignment of liquid crystal molecules, which is contained between first substrate 210 and second substrate 220, is changed in response to the electric field formed between the common electrode and the pixel electrode. The change of alignment of liquid crystal molecules causes change of light transmission passing the liquid crystal.

Backlight unit 300 transmits light into main display panel 200 in order to provide light to main display panel 200. Backlight unit 300 includes reflective sheet 320, mold frame 330, light guide plate 340, optical sheets 350, and rim frame 360. Backlight unit 300 receives light from light source device 310, which is mounted on second substrate portion 120 of first flexible printed circuit board 100. Light source device 310 produces light of predetermined brightness in response to a driving signal transferred to second substrate portion 120 of first flexible printed circuit board 100.

Light guide plate 340 transmits the light generated from light source device 310 to main display unit 200 through upper surface of light guide plate. As shown in FIG. 3, light source device 310 is placed on a side of light guide plate 340. Therefore, light guide plate 340 supplies light, which is supplied from a side of light guide plate 340, upwards to main display unit 200. Herein, an upper or lower surface of light guide plate 340 is surfaces substantially parallel to surfaces of main display unit 200, and side of light guide plate is a surface that is not the upper or lower surface of light guide plate 340.

Reflective sheet 320 is arranged on a lower surface of light guide plate 340 to reflect light, which is leaked from light guide plate 340 or from other elements, back into light guide plate 340. Therefore, reflective sheet 320 prevents waste of light, and improves light efficiency. Optical sheets 350 improves the brightness of light supplied from light guide plate 340, and provides the light into main display panel 200. Mold frame 330 encloses sides of light guide plate 340, and includes mounting groove 320a in which light source device 310, which is mounted on second substrate portion 120, is placed. Bezel 400 supports main display panel 200 and backlight unit 300 from the bottom, and is generally manufactured with metal.

Sub-display module S includes sub-display panel 600 that displays images in an opposite direction from main display panel 200. Sub-display panel 600 can be a liquid crystal display panel or an organic electro-luminescence display panel that includes an organic electro-luminescence element.

The organic electro-luminescence display panel is a display panel using a principle of electro-luminescence phenomenon of organic thin film layer. The electro-luminescence element of organic thin film layer emits light when electric field is applied to the organic thin film layer. The organic electro luminescence display panel includes a first substrate, which includes an organic thin film, and a second substrate, which prevents the organic thin film from being exposed to air. The organic electro-luminescence display panel can be driven by passive driving method or by active driving method. For the active driving method, active driving element such as thin film transistor can be included in the organic electro-luminescence display panel. Further detailed description of the organic-electro luminescence display will be omitted.

Printed circuit board 500 applies signals to main display panel 200, sub-display panel 600, and backlight unit 300 through first flexible printed circuit board 100 in response to the control signals supplied from an external device or a user. Printed circuit board 500 includes main terminal portion 510 to be connected to terminal 141 (shown in FIG. 2B) of third substrate portion 140 of first flexible circuit substrate 100, and a sub-terminal portion (not shown) of printed circuit board 500 to be connected to terminal 710 of second flexible circuit board 700. Sub-terminal 720 of second flexible circuit board 700 is connected to sub-display panel 600. Printed circuit board 500 can have a groove in which sub-display panel 600 is positioned, but depending on the structures of printed circuit board 500 and sub-display panel 600, printed circuit board 500 may not have the groove.

First flexible printed circuit board 100 transfers electrical signals supplied from printed circuit board 500 to backlight unit 300 and main display panel 200. In other words, first flexible printed circuit board 100 transfers the electrical signals, which are transferred to printed circuit board 500 from an external device, to main display panel 200 as well as the components installed on first flexible printed circuit board 100, which includes light source device 310.

Figure 4:
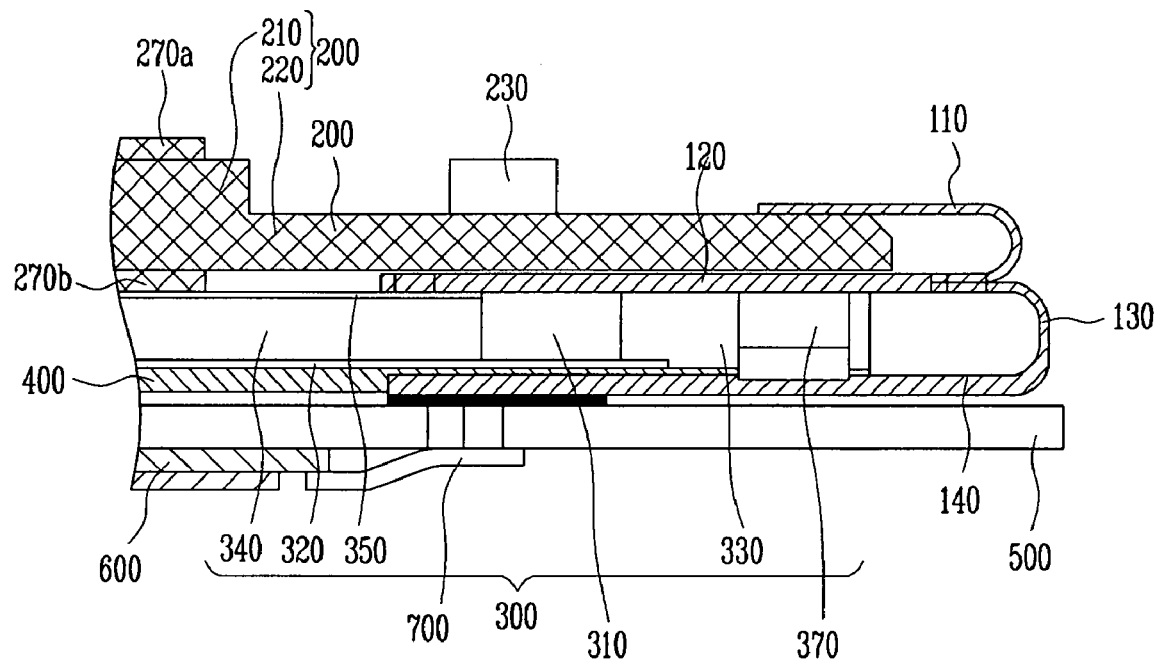
FIG. 4 is a cross-sectional view showing a dual type flat panel display device constructed according to the principles of one embodiment of the present invention.

FIG. 4 shows how first flexible printed circuit board 100 is connected to main display panel 200, to backlight unit 300, and to printed circuit board 500. As described referring to FIGS. 2A and 2B, first flexible printed circuit board 100 includes first substrate portion 110, second substrate portion 120, connection substrate portion 130, and third substrate portion 140. FIG. 4 shows only an edge portion of main display unit 200 and backlight unit 300, where first flexible printed circuit board 100 is connected to these elements. FIG. 4 also shows how first flexible printed circuit board 100 can be bent to be connected to each of main display panel 200, backlight unit 300, and printed circuit board 500.

As shown in FIG. 4, backlight unit 300 is placed between printed circuit board 500 and main display unit 200. First flexible circuit board 100 is arranged to be coupled to each of printed circuit board 500, backlight unit 300, and main display unit 200.

First substrate portion 110, which is connected to main display panel 200, includes terminal 111 (shown in FIG. 2B). Terminal 111 includes a conductive wiring layer, and the conductive wiring layer of terminal 111 contacts pad portion 240 (shown in FIG. 3) of main display panel 200. Therefore, main display panel 200 is connected to first flexible printed circuit board 100 through first substrate portion 110. One width side of first substrate portion 110 is connected to a width side of second substrate portion 120, and the opposite width side of first substrate portion 110 is connected to pad portion 240 of main display panel 200. As shown in FIG. 4, because second substrate portion 120 is disposed between backlight unit 300 and main display panel 200, first substrate portion 110 is considerably bent to be connected to both of second substrate portion 120 and main display panel 200. It is preferable that the thickness of first substrate portion 110 is smaller than the thicknesses of second substrate portion 120 and third substrate portion 140. Thinner first substrate portion 110 has more flexibility than thicker second substrate portion 120 and third substrate portion 140, which are not necessarily to be bent.

Second substrate portion 120 is positioned between main display panel 200 and backlight unit 300. Second substrate portion 120 is placed around an edge regions of main display panel 200 (non-display area), and therefore does not interrupt light transmission between backlight unit 300 and main display panel 200. Light source device 310, which is installed on second substrate portion 120, is positioned between main display panel 200 and printed circuit board 500. Light source device 310 is also placed within mold frame 330 on a side of light guide place 340. The position of light source device 310 is secured by mounting groove 320a (shown in FIG. 3) of mold frame 330.

Backlight unit 300 is placed on the bottom surface of main display panel 200. Backlight unit 300 includes reflective sheet 320, light guide plate 340, optical sheet 350, and rim frame 360 (shown in FIG. 3). Light guide plate 340, optical sheet 350, and rim frame 360 are placed within a display area of main display panel 200 where pixel electrodes are formed and images are displayed. Light guide plate 340, optical sheet 350, and rim frame 360 are also placed within mold frame 330. Mounting groove 320a of mold frame 330 is placed in a non-display area, and holds light source device 310.

As second substrate portion 120 is placed between main display panel 200 and backlight unit 300, light source device 310 is positioned inside backlight unit 300 in a manner that light source device 310 fits into mounting groove 320a. Therefore, light source device 310 is securely positioned on a side of light guide plate 340, and transmits light into light guide plate 340. Second substrate portion 120 can further includes other driving elements such as boosting circuit 370, which boosts voltage before applying the voltage to main display panel 200. Mold frame 330 includes groove 370a to securely place the other driving elements such as boosting circuit 370 within mode frame 330.

Third substrate portion 140 is disposed between backlight unit 300 and printed circuit board 500. Therefore, connection substrate portion 130 bends to connect second substrate portion 120 to third substrate portion 130. A conductive wiring layer of connection substrate portion 130 is formed in a single layer as in first substrate portion 110. In this case, the thickness of connection substrate portion 130 is smaller than the thicknesses of second substrate portion 120 and third substrate portion 130, in which the conductive wiring layer is generally formed in multiple layers and is not to be easily bent.

Third substrate portion 140 is a portion of first flexible printed circuit board 100 that is connected to printed circuit board 500. Third substrate portion 140 includes at least one terminal 141 (shown in FIG. 2B) to be connected to main terminal portion 510 of printed circuit board 500. At this time, main terminal portion 510 of printed circuit board 500 and terminal 141 of first flexible printed circuit board 100 are connected by soldering. Third substrate portion 140 does not include a driving element, and therefore, length of third substrate portion 140 is normally short.

In the case that main display panel 200 is a liquid crystal display, the liquid crystal display has polarizing plates 270a and 270b, which are placed on the top of first substrate 210 and on the bottom of second substrate 220, respectively. Detailed description of polarizing plates 270a and 270b will be omitted.

Second flexible printed circuit board 700 (shown in FIG. 3) transfers electrical signals from printed circuit board 500 to sub-display panel 600 to drive sub-display unit 600. Sub-terminal portion 720 of second flexible circuit board 700 is connected to sub-display unit 600, and terminal portion 710 of second flexible circuit board 700 is connected to sub-terminal portion of printed circuit board 500 (not shown).

Referring to FIG. 5A to FIG. 5E, an assembly process of first flexible printed circuit board 100 constructed as the embodiment of the present invention will be described. The assembly process shown in FIGS. 5A-5E is to describe how first flexible printed circuit board 100 is connected to other elements, and the actual assembly process of a flat panel display device is not limited to the steps described hereafter.

Figure 5A:
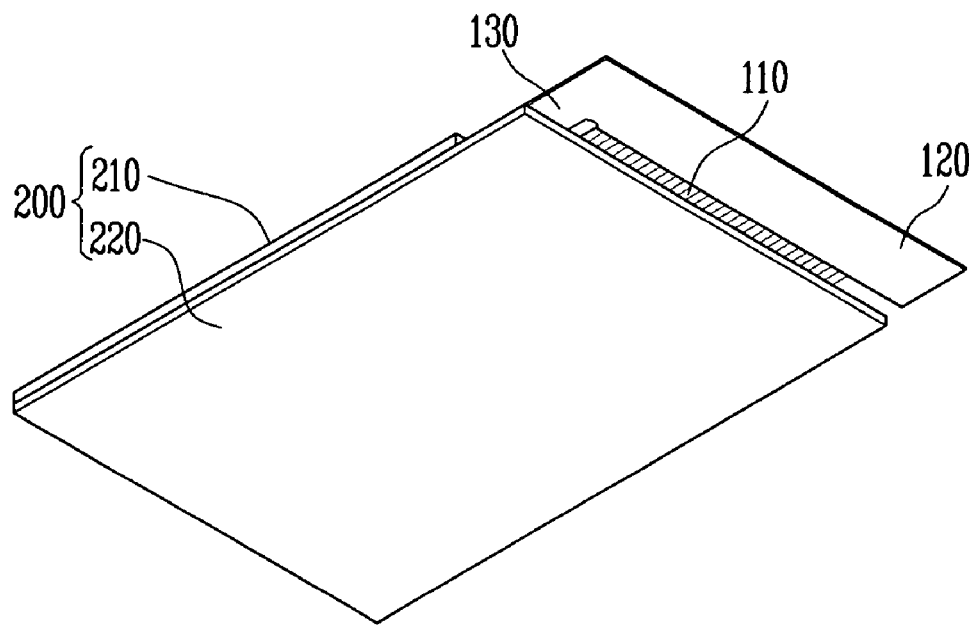
FIG. 5A to FIG. 5E are perspective views showing assembly processes to assemble the flexible printed circuit board of one embodiment of the present invention on a dual type flat panel display device.
Figure 5B:
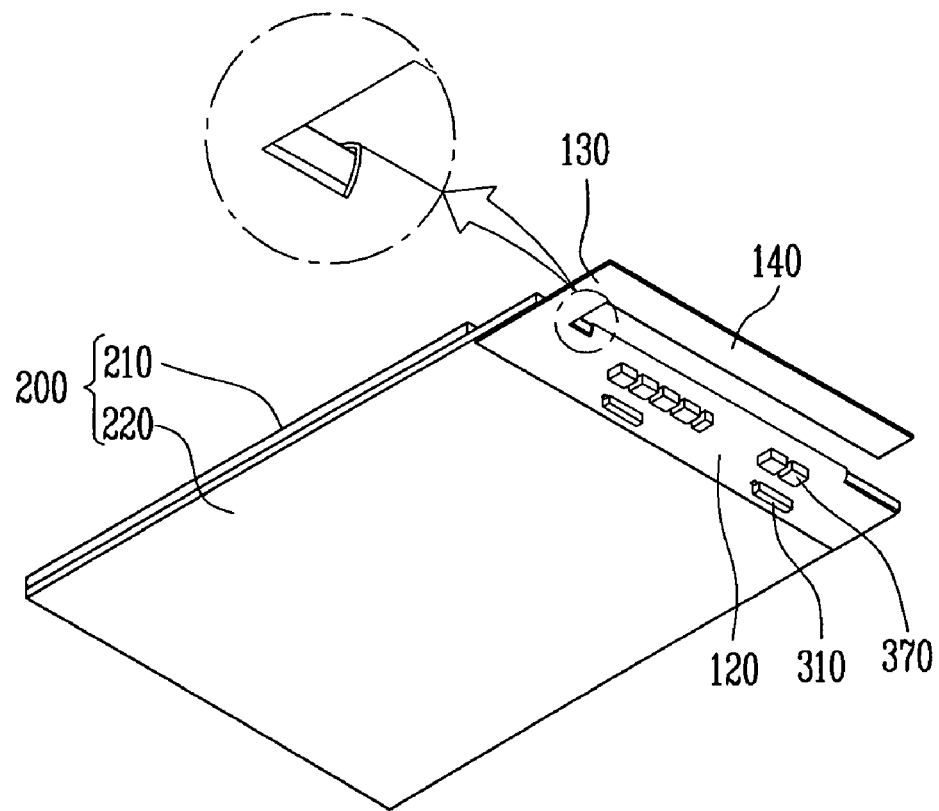
Figure 5C:
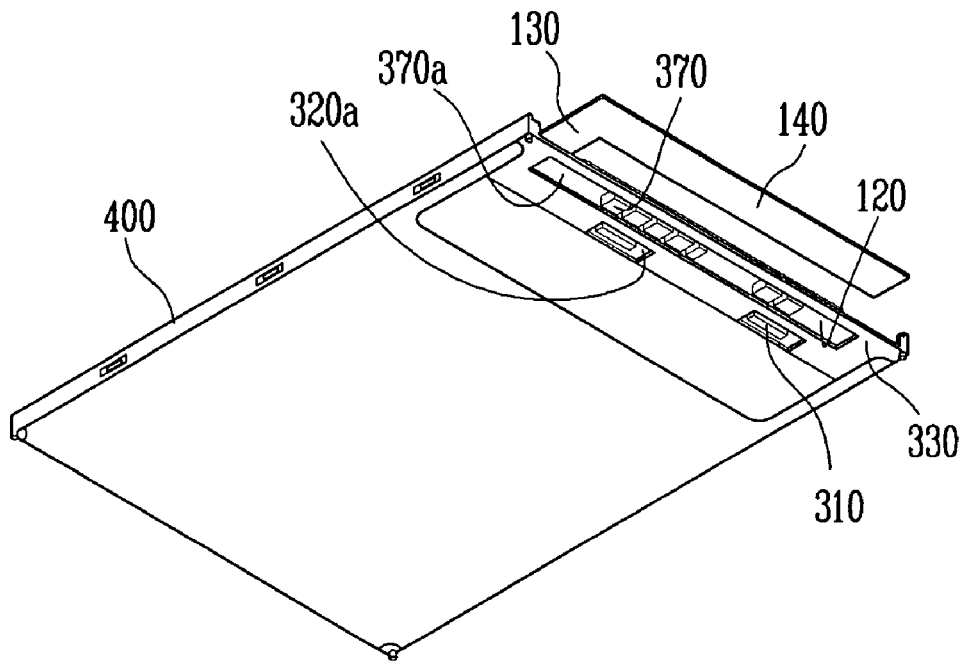
Figure 5D:
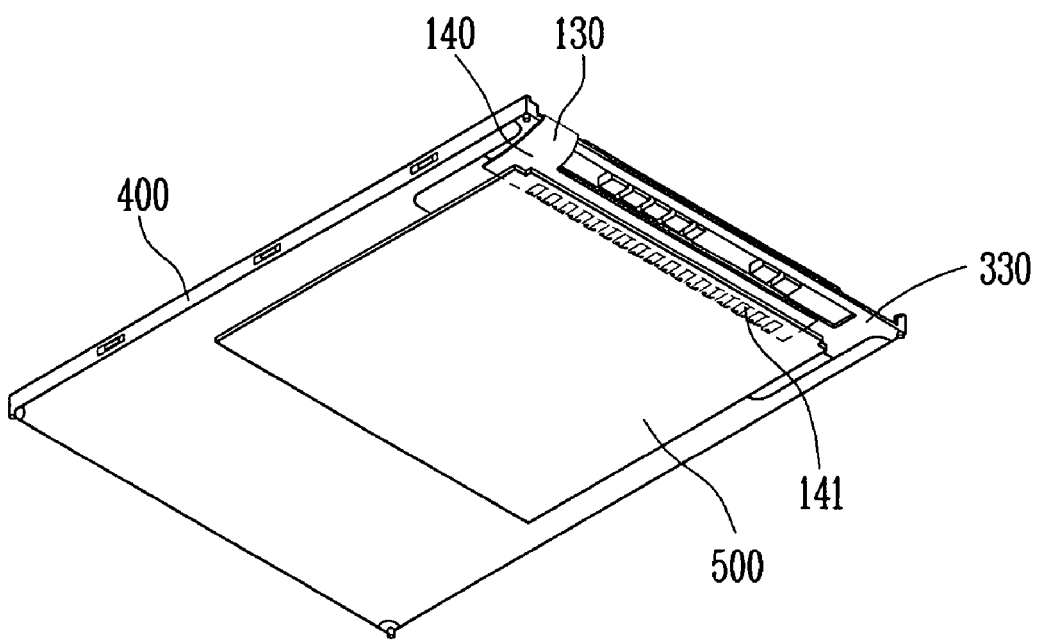

For the first step, terminal 111 of first substrate portion 110 of first flexible printed circuit board 100 is connected to pad portion 240 of main display panel 200 as shown in FIG. 5A. Then, second substrate portion 120 is positioned on the bottom surface of main display panel 200 by bending first substrate portion 110 as shown in FIG. 5B. Backlight unit 300 is placed on the bottom surface of main display panel 200, and second substrate portion 120 is inserted between backlight unit 300 and main display panel 200. Light source device 310 installed on second substrate portion 120 is positioned in mounting groove 320a formed on mold frame 330 of backlight unit 300 as shown in FIG. 5C. Terminal 141 of third substrate portion 140 and main terminal portion 510 of printed circuit board 500 are soldered. Connection substrate portion 130 is bent so that third substrate portion 140 and printed circuit board 500 are positioned on the bottom surface of backlight unit 300 as shown in FIG. 5D. During the process of soldering of printed circuit board 500 and third substrate portion 140, heat is not transferred to second substrate portion on which light source device 310 is mounted. Therefore, second substrate portion 120 is not affected by the heat, and light source device 310 mounted on second substrate portion 120 can maintain a predetermined position and can maintain uniform brightness.

Figure 5E:
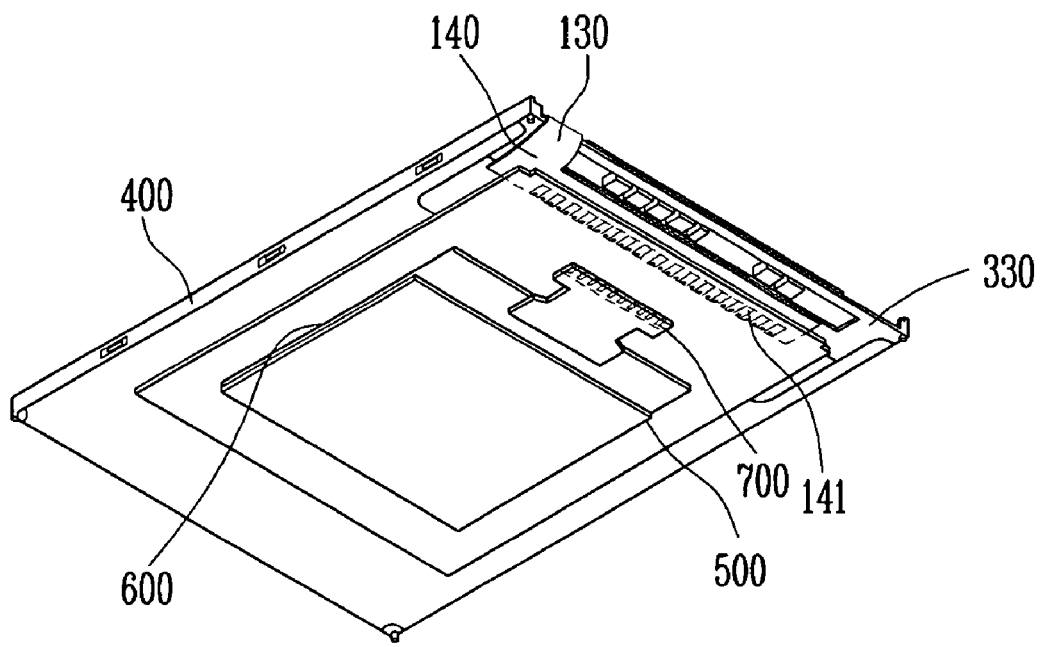

Terminal portion 710 and sub-terminal portion of printed circuit substrate 500 are soldered, and sub-terminal portion 720 and a pad portion of sub-display panel 600 are soldered. Sub-display panel 600 is placed on the bottom surface of printed circuit board 500 as shown in FIG. 5E.

Figure 6:
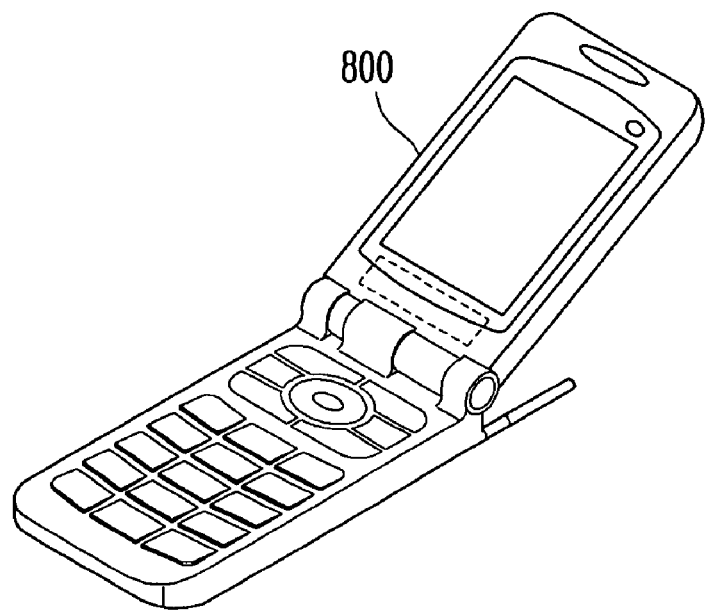
FIG. 6 is a perspective view showing a cellular phone in which a flat panel display device of one embodiment of the present invention is installed.

FIG. 6 shows a cellular phone with a dual type flat panel display device constructed according to the principles of the present invention. In the case of a flip type cellular phone 800, the dual type flat panel display provides images in both surfaces of the flip part of cellular phone 800.

Although a few embodiments of the present invention have been shown and described, a skilled person can devise further embodiments, modifications and variations of the invention on the basis of the teachings disclosed herein. For example, the change in a display panel structure of a liquid crystal display device, the change in a structure of a backlight unit structure and the change in a structure of a printed circuit board and the combination relations thereof, etc., can be made without departing from the scope of the invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A flat panel display device comprising:
   a main display panel;
   a sub-display panel;
   a printed circuit board disposed between the main display panel and the sub-display panel, the printed circuit board including a main terminal portion and a sub-terminal portion;
   a backlight unit disposed between the printed circuit board and the main display panel, the backlight unit transmitting light into the main display panel;
   a first flexible printed circuit board including:
      a first substrate portion connected to the main display panel;
      a second substrate portion disposed between the main display panel and the backlight unit, the second substrate portion connected to the first substrate portion, the second substrate portion including at least one light source device to transmit light into the backlight unit;
      a third substrate portion disposed between the backlight unit and the printed circuit board, the third substrate portion connected to the main terminal portion of the printed circuit board; and
      a connection substrate portion connecting the second substrate portion to the third substrate portion;
   a second flexible printed circuit board connecting the sub-display panel to the sub-terminal portion of the printed circuit board.

2. The flat panel display device as claimed in claim 1, wherein the backlight unit comprises:
   a light guide plate aligned substantially parallel to the main display panel, the light guide plate transmitting light to the main display panel through upper surface of the light guide plate, the light source device being placed on a side of the light guide plate;
   a mold frame enclosing the light guide plate, the mold frame including a mounting groove, the light source device being placed in the mounting groove.

3. The flat panel display device as claimed in claim 1, comprised of the second substrate portion including at least two light source devices.

4. The flat panel display device as claimed in claim 1, comprised of the light source device including a light emitting diode.

5. The flat panel display device as claimed in claim 1, wherein the second substrate portion further includes a boosting circuit for boosting voltage that is to be applied to the display panel.

6. The flat panel display device as claimed in claim 1, wherein the length of the first substrate portion is shorter than the length of the connection substrate portion.

7. The flat panel display device as claimed in claim 1, wherein the width of the first substrate portion is larger than the width of the connection substrate portion.

8. The flat panel display device as claimed in claim 1, wherein the thickness of the first substrate portion is smaller than the thickness of the second substrate portion.

9. The flat panel display device as claimed in claim 8, wherein the first substrate portion includes a single conductive wiring layer, and the second substrate portion includes multiple conductive wiring layers.

10. The flat panel display device as claimed in claim 1, wherein the main display panel includes a liquid crystal display panel, and the sub-display panel includes an organic electro luminescence display panel.

11. The flat panel display device as claimed in claim 1, wherein one end of the connection substrate portion is connected to the second substrate portion, and the opposite end of the connection substrate portion is connected to the third substrate portion.

12. The flat panel display device as claimed in claim 1, comprised of the connection substrate portion including:
   a first connection substrate portion connecting one end of the second substrate portion to one end of the third substrate portion; and
   a second connection substrate portion connecting the other end of the second substrate portion to the other end of the third substrate portion.

13. The flat panel display device as claimed in claim 1, wherein the thickness of the connection substrate portion is smaller than the thickness of the third substrate portion.

14. The flat panel display device as claimed in claim 13, wherein the connection substrate portion includes a single conductive wiring layer, and the third substrate portion includes multiple conductive wiring layers.

15. A portable display apparatus comprising the liquid crystal display device as claimed in claim 1.

* * * * *